United States Patent
Lee

(10) Patent No.: US 10,720,293 B2
(45) Date of Patent: Jul. 21, 2020

(54) APPARATUS AND METHOD OF PREVENTING MALFUNCTION OF CIRCUIT BREAKER IN METAL-CLAD AND METAL ENCLOSED SWITCHGEAR

(71) Applicant: KEPCO ENGINEERING AND CONSTRUCTION COMPANY, INC., Gyeongsangbuk-do (KR)

(72) Inventor: Cheoungjoon Lee, Seoul (KR)

(73) Assignee: KEPCO ENGINEERING AND CONSTRUCTION COMPANY, INC., Gyeonggi-Do (KR)

( * ) Notice: Subject to any disclaimer, the term of this patent is extended or adjusted under 35 U.S.C. 154(b) by 462 days.

(21) Appl. No.: 15/798,177

(22) Filed: Oct. 30, 2017

(65) Prior Publication Data

US 2018/0294119 A1    Oct. 11, 2018

(30) Foreign Application Priority Data

Apr. 10, 2017  (KR) .................... 10-2017-0046295

(51) Int. Cl.
- *H01H 47/02* (2006.01)
- *G01R 31/333* (2006.01)
- *H01H 47/00* (2006.01)

(52) U.S. Cl.
CPC ......... *H01H 47/02* (2013.01); *G01R 31/3333* (2013.01); *H01H 47/001* (2013.01); *H01H 47/002* (2013.01)

(58) Field of Classification Search
CPC .... H01H 47/001; H01H 47/002; H01H 47/02; G01R 31/3333

USPC ......................................................... 361/170
See application file for complete search history.

(56) References Cited

FOREIGN PATENT DOCUMENTS

| JP | 59-169023 | 9/1984 |
|----|-----------|--------|
| KR | 10-2008-0062840 | 7/2007 |
| KR | 101376214 | 3/2014 |

OTHER PUBLICATIONS

Westinghouse Electric Corporation "Instructions for Porcel-line Type DHP Magnetic Air Circuit Breakers" Sep. 1978 (Year: 1978).*
KIPO; KR application 10-2017-0046295 Office Action dated Apr. 18, 2018; 6 pages.
Hyundai-Electric Vacuum Circuit Breaker, Instruction Manual; online: http://www.hyundai-electric.com/elec/ko/customer/downloadlist.jsp.

* cited by examiner

*Primary Examiner* — Kevin J Comber
(74) *Attorney, Agent, or Firm* — Schwabe, Williamson & Wyatt, P.C.

(57) ABSTRACT

According to an embodiment of the present disclosure, an apparatus of preventing a malfunction of a circuit breaker may include a circuit breaker and a variable resistor installed on a distributing board, the variable resistor being disposed outside the circuit breaker separately from the circuit breaker, wherein the variable resistor is connected in parallel to an anti-pumping auxiliary relay $R_W$, and total resistance of the anti-pumping auxiliary relay $R_W$ and the variable resistor connected in parallel to each other is less than resistance of the anti-pumping auxiliary relay $R_W$.

7 Claims, 5 Drawing Sheets

BACKGROUND

BACKGROUND

APPARATUS AND METHOD OF PREVENTING MALFUNCTION OF CIRCUIT BREAKER IN METAL-CLAD AND METAL ENCLOSED SWITCHGEAR

CROSS-REFERENCE TO RELATED APPLICATION

This application claims the benefit of Korean Patent Application No. 10-2017-0046295, filed on Apr. 10, 2017, in the Korean Intellectual Property Office, the disclosure of which is incorporated herein in its entirety by reference.

BACKGROUND

1. Field

One or more embodiments relate to an apparatus of controlling a circuit breaker, and more particularly, to a method of controlling a malfunction of a circuit breaker used in general industries and a Man-Machine Interface System (MMIS) which is control equipment for a nuclear power plant.

2. Description of the Related Art

Nuclear power plants and general industries use commercialized circuit breaker products. Also, in many cases, commercialized relay products are used as internal relays of the circuit breakers. However, in these cases, the resistance of an anti-pumping auxiliary relay, which is an auxiliary device in the circuit breaker, used in a circuit breaker increases so that a malfunction occurs between an MMIS, which has a function of coil monitoring, and the anti-pumping auxiliary relay.

In order to prevent the malfunction, a method of replacing the circuit breaker or a method of replacing the anti-pumping auxiliary relay in the circuit breaker has been used. However, high cost and an effort are required to replace components of the circuit breaker and to re-test the circuit breaker.

Prior Art Document

Korean Patent Publication No. 10-1376214B1

SUMMARY

One or more embodiments of the present disclosure are to overcome a problem in which a malfunction of a breaker control circuit occurs in a Man-Machine Interface System (MMIS), which is power plant control equipment for a nuclear power plant.

One or more embodiments of the present disclosure are to overcome a problem in which a malfunction occurs between an MMIS which is power plant control equipment for a nuclear power plant and an anti-pumping auxiliary relay which is an auxiliary device in a circuit breaker.

One or more embodiments of the present disclosure are to overcome a problem that when a commercialized circuit breaker is applied like an embodiment shown in FIG. 2, the resistance of relay $R_W$ in the circuit breaker increases compared to the resistance of an MMIS coil monitoring relay so that after a distributing board including a breaker control circuit is connected to an MMIS control circuit and the circuit breaker is first closed and opened, the circuit breaker does not operate when it is secondarily closed.

In order to overcome the above-described problems, a method of lowering resistance of an anti-pumping auxiliary relay has been used, however, the method increases a size of the relay so that there is still a problem that it is difficult to install the relay in the circuit breaker.

Additional aspects will be set forth in part in the description which follows and, in part, will be apparent from the description, or may be learned by practice of the presented embodiments.

According to one or more embodiments of the present disclosure, an apparatus of preventing a malfunction of a circuit breaker may include: a first Man-Machine Interface System (MMIS) including an MMIS closing coil monitoring relay $R_{CM}$; a second MMIS including an MMIS trip coil monitoring relay $R_{TM}$; a circuit breaker including a breaker closing coil relay $R_{CC}$, a breaker trip coil relay $R_{TC}$, and an anti-pumping auxiliary relay $R_W$; and a resistance adjustment unit installed on a distributing board, and configured as a variable resistor connected in parallel to the anti-pumping auxiliary relay $R_W$ in the circuit breaker, wherein the anti-pumping auxiliary relay $R_W$ is configured to perform anti-pumping when the circuit breaker is closed.

Resistance of the variable resistor may be set to a value varying according to the anti-pumping auxiliary relay $R_W$ and the MMIS closing coil monitoring relay $R_{CM}$.

The resistance adjustment unit may be configured to lower total resistance produced as resistance of the variable resistor connected in parallel to the anti-pumping auxiliary relay $R_W$, thereby preventing a malfunction of the circuit breaker.

According to one or more embodiments of the present disclosure, an apparatus of preventing a malfunction of a circuit breaker includes a circuit breaker and a variable resistor respectively installed on a distributing board, the variable resistor being disposed outside the circuit breaker separately from the circuit breaker, wherein the circuit breaker includes: a breaker closing coil relay $R_{CC}$; a breaker trip coil relay $R_{TC}$; and an anti-pumping auxiliary relay $R_W$ configured to perform anti-pumping when the circuit breaker is closed, wherein the variable resistor is connected in parallel to the anti-pumping auxiliary relay $R_W$, and total resistance of the variable resistor and the anti-pumping auxiliary relay $R_W$ connected in parallel to each other is less than resistance of the anti-pumping auxiliary relay $R_W$.

According to one or more embodiments of the present disclosure, a method of detecting a malfunction of a circuit breaker includes: connecting a variable resistor installed on a distributing board together with an anti-pumping auxiliary relay $R_W$ in a circuit breaker in parallel to the anti-pumping auxiliary relay $R_W$ to reduce total resistance; causing current to flow continuously to the breaker closing coil relay $R_{CC}$ installed in the circuit breaker and connected in series to an MMIS closing coil monitoring relay $R_{CM}$ included in a first MMIS, and causing current to flow continuously to the breaker trip coil relay $R_{TC}$ installed in the circuit breaker and connected in series to an MMIS trip coil monitoring relay $R_{TM}$ included in a second MMIS; and providing a notice when the MMIS closing coil monitoring relay $R_{CM}$ and the MMIS trip coil monitoring relay $R_{TM}$ detect a circuit disconnection.

BRIEF DESCRIPTION OF THE DRAWINGS

These and/or other aspects will become apparent and more readily appreciated from the following description of the embodiments, taken in conjunction with the accompanying drawings in which.

DETAILED DESCRIPTION

Hereinafter, embodiments of the present disclosure will be described with reference to the accompanying drawings.

Figure 1:
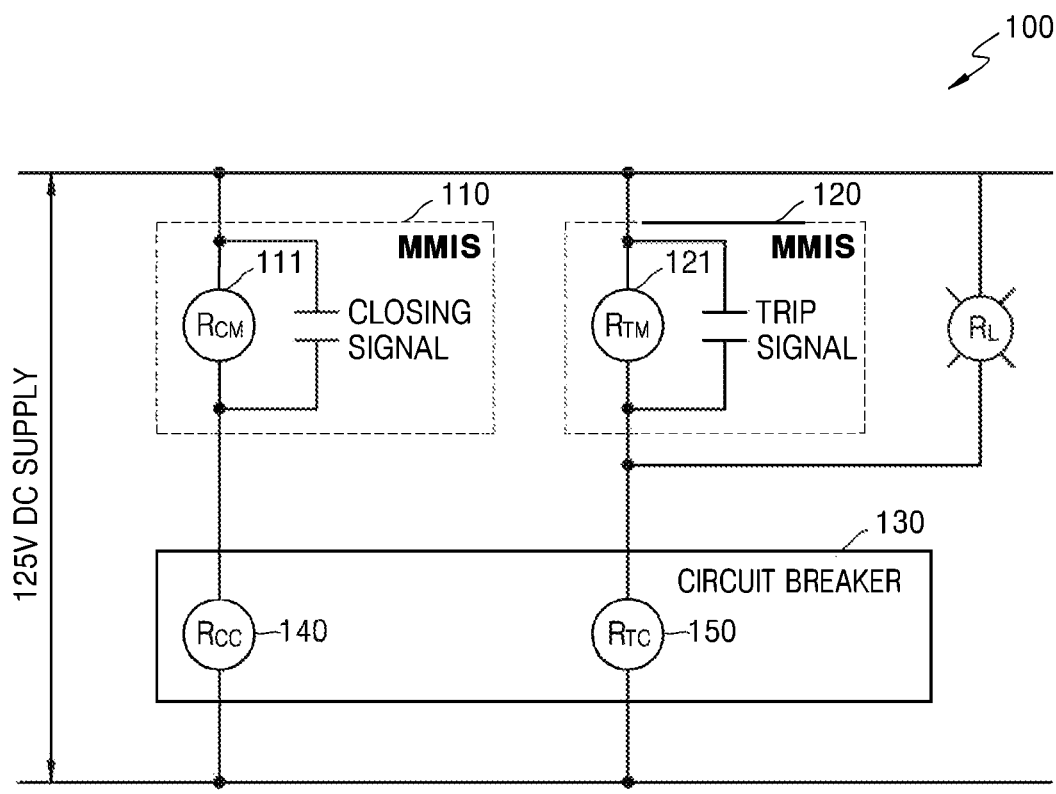
FIGS. 1 and 2 show an example of a coil monitoring circuit including a circuit breaker used in a Man-Machine Interface System (MMIS)
Figure 2:
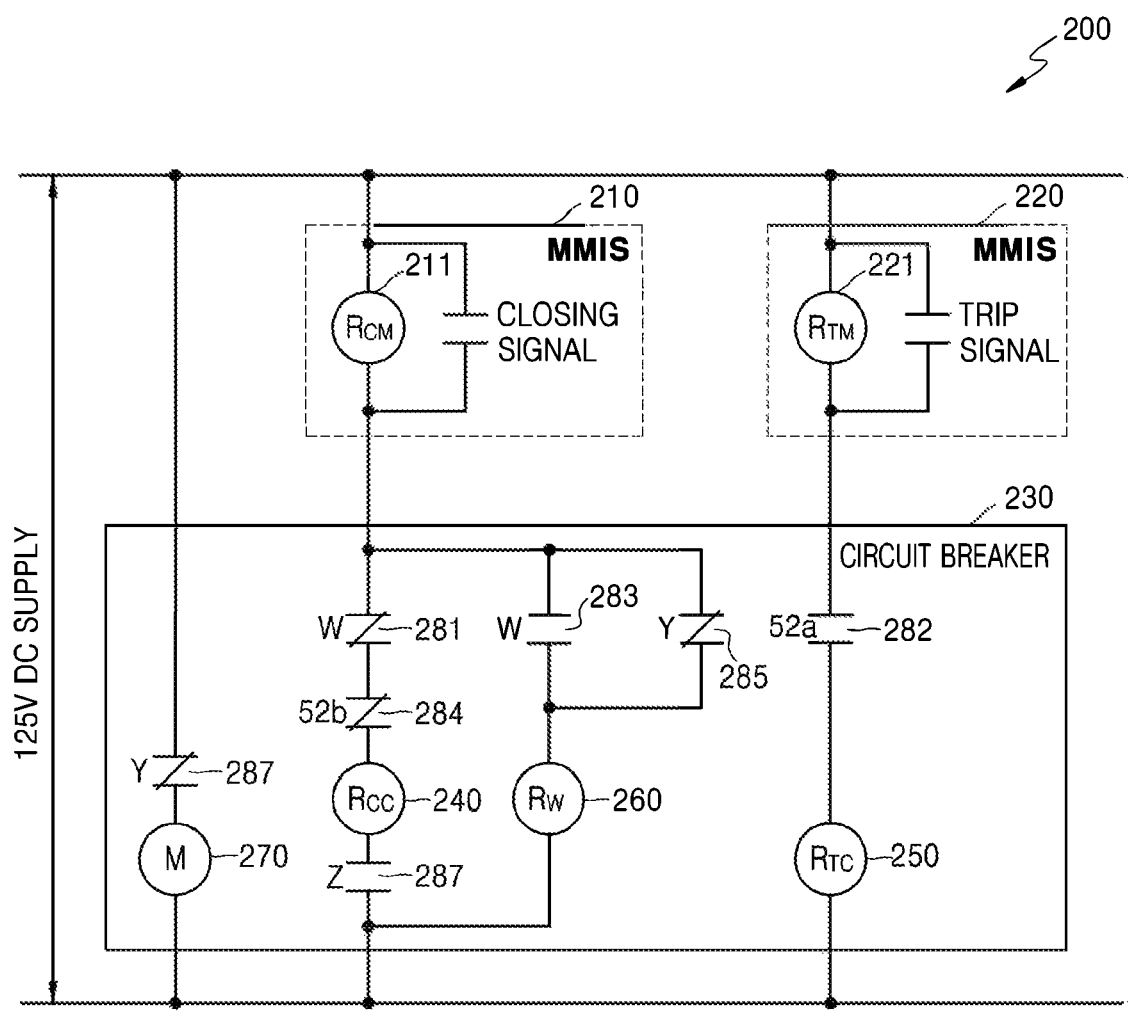

FIGS. 1 and 2 show an example of a coil monitoring circuit including a circuit breaker used in a Man-Machine Interface System (hereinafter, MMIS).

For example, a distributing board on which a coil monitoring circuit 100 is mounted may include an MMIS 110 including an MMIS closing coil monitoring relay ($R_{CM}$) 111, an MMIS 120 including an MMIS trip coil monitoring relay ($R_{TM}$) 121, and a circuit breaker 130. The circuit breaker 130 may include a breaker closing coil relay ($R_{CC}$) 140 and a breaker trip coil relay ($R_{TC}$) 150.

According to another example, a distributing board on which a coil monitoring circuit 200 is mounted may include MMISs 210 and 220, which are control equipment for a power plant, and a circuit breaker 230. The coil monitoring circuit 200 may include a high-resistance MMIS closing coil monitoring relay ($R_{CM}$) 211 and a high-resistance MMIS trip coil monitoring relay ($R_{TM}$) 221, respectively, in the MMISs 210 and 220, which are control equipment for a power plant.

The circuit breaker 230 may include a motor (M) 270 for energy storage for closing operation, an anti-pumping auxiliary relay ($R_W$) 260 for anti-pumping upon a closing operation of the circuit breaker 230, and electrical components 281, 282, 283, 284, and 285 such as auxiliary contacts 52a, 52b, W, Y, and Z. In FIGS. 2, 52a (282) and 52b (284) represent auxiliary switch contacts. Also, W (283) represents an auxiliary switch contact of the anti-pumping auxiliary relay ($R_W$) 260. Also, Y (285) represents a cut-off switch which is opened when a closing spring is completely charged. Z (287) represents a cut-off switch which is closed when a closing spring is completely charged.

The circuit breaker 230 may also include a breaker closing coil relay ($R_{CC}$) 240 and a breaker trip coil relay ($R_{TC}$) 250. The high-resistance MMIS closing coil monitoring relay ($R_{CM}$) 211 and the high-resistance MMIS trip coil monitoring relay ($R_{TM}$) 221 in the MMISs 210 and 220, which are control equipment for a power plant, may be respectively connected in series to the breaker closing coil relay ($R_{CC}$) 240 and the breaker trip coil relay ($R_{TC}$) 250 in the circuit breaker 230 to cause micro current of several μA to flow continuously.

The coil monitoring circuit 200 may issue a warning to a manager when a coil of the breaker closing coil relay ($R_{CC}$) 240 to the breaker trip coil relay ($R_{TC}$) 250 is disconnected.

In many cases, a power distributing board for a nuclear power plant using the coil monitoring circuit 100 or 200 shown in FIGS. 1 and 2 is manufactured as a full closed type of case by applying the commercialized circuit breaker 130 or 230 so that a power charger (not shown) is not exposed. Also, in many cases, the motor 270, the breaker closing coil relay ($R_{CC}$) 240, and the breaker trip coil relay ($R_{TC}$) 250 used in the circuit breaker 230 are commercialized products.

However, in the commercial circuit breaker 230, resistance of the anti-pumping auxiliary relay ($R_W$) 260 is a hundred times greater than that of the breaker closing coil relay ($R_{CC}$) 240.

For example, if the resistance of the high-resistance MMIS closing coil monitoring relay ($R_{CM}$) 211 and the high-resistance MMIS trip coil monitoring relay ($R_{TM}$) 221 is tens of kΩ, the resistance of the anti-pumping auxiliary relay ($R_W$) 260 may be several to tens of kΩ.

In the power distributing board for a nuclear power plant using the coil monitoring circuit 100 or 200 shown in FIGS. 1 and 2, there is a phenomenon that after the circuit breaker 230 is first closed and opened, the circuit breaker 230 does not operate when it is secondarily closed.

The phenomenon is generated because the resistance of the anti-pumping auxiliary relay ($R_W$) 260 is greater by a predetermined value or more than the resistance of the MMIS closing coil monitoring relay ($R_{CM}$) 211 of the MMIS 210 so that the anti-pumping auxiliary relay ($R_W$) 260 needed to be demagnetized upon removal of a signal for closing the MM IS 210 is not demagnetized.

If the resistance of the MMIS closing coil monitoring relay ($R_{CM}$) 211 of the MMIS 210 is sufficiently greater than the resistance of the anti-pumping auxiliary relay ($R_W$) 260, the anti-pumping auxiliary relay ($R_W$) 260 may be demagnetized when a signal for closing the MMIS 210 is removed. However, if the resistance of the anti-pumping auxiliary relay ($R_W$) 260 is greater by a predetermined value or more than the resistance of the MMIS closing coil monitoring relay ($R_{CM}$) 211 of the MMIS 210, a malfunction may occur.

In order to prevent the malfunction between the power plant control equipment applied to a nuclear power plant and the breaker control circuit, a method of replacing the anti-pumping auxiliary relay ($R_W$) 260 has typically been used. However, reducing the resistance of the anti-pumping auxiliary relay ($R_W$) 260 increases the size of the anti-pumping auxiliary relay ($R_W$) 260, so that it is difficult to install the anti-pumping auxiliary relay ($R_W$) 260 in the circuit breaker 230, and there is inconvenience that a performance test needs to be again performed again to determine whether the anti-pumping auxiliary relay ($R_W$) 260 operates properly in the circuit breaker 230.

According to an embodiment of the present disclosure, a method of connecting a variable resistor in parallel to an anti-pumping auxiliary relay in a distributing board outside a circuit breaker in order to lower electrical resistance of the anti-pumping auxiliary relay to thereby lower total electrical resistance is suggested in order to prevent the malfunction between the power plant control equipment applied to the nuclear power plant and the breaker control circuit. In this case, it is unnecessary to replace the anti-pumping auxiliary relay used in the circuit breaker. Also, it is possible to install parallel resistors matching with different characteristics of various circuit breakers in a distributing board.

Figure 3:
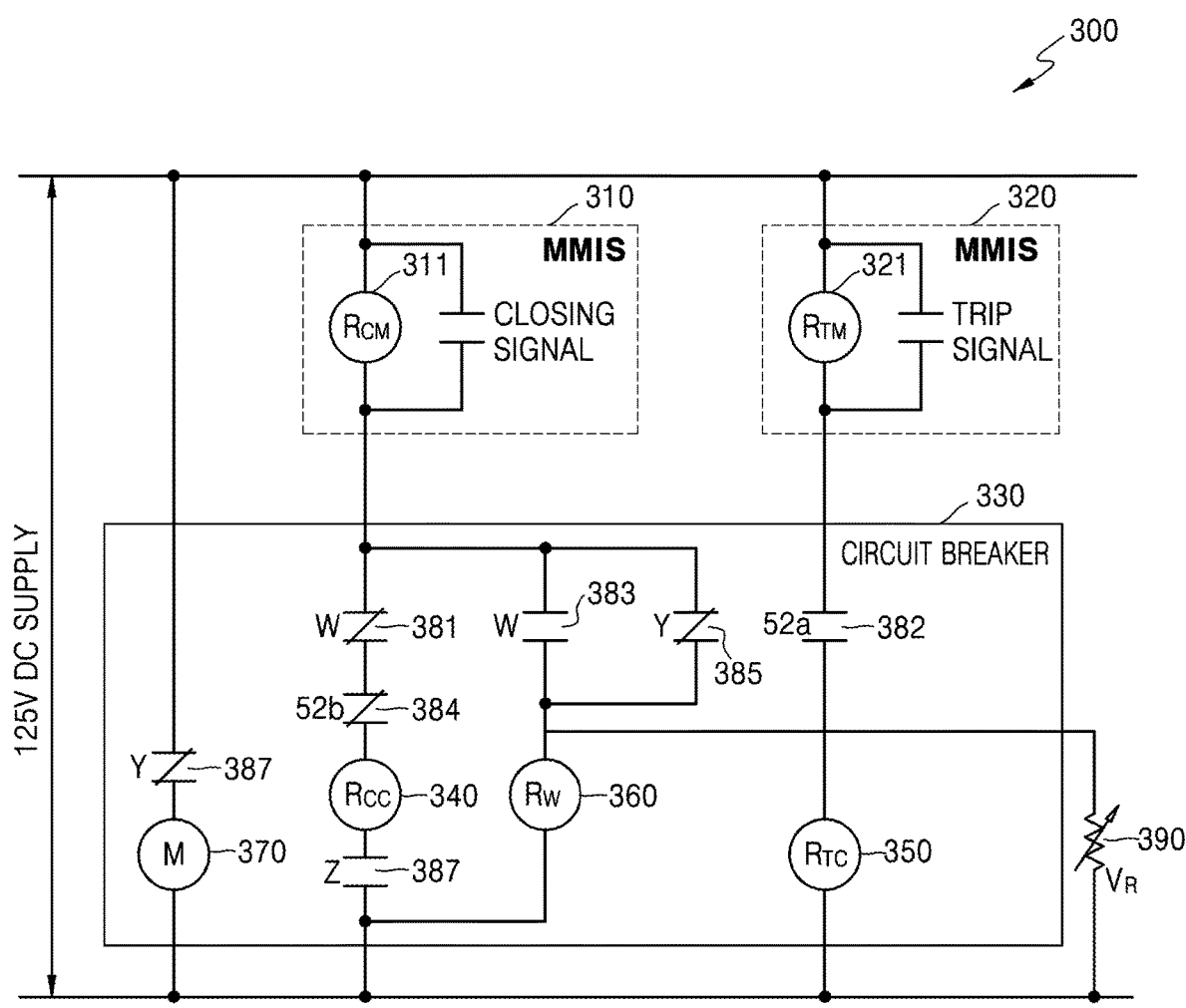
FIGS. 3 and 4 show an example of a circuit of detecting a malfunction of a circuit breaker, according to an embodiment of the present disclosure.

FIG. 3 shows a distributing board on which a coil monitoring circuit 300 is mounted, according to an embodiment of the present disclosure; and The coil monitoring circuit 300 may include MMISs 310 and 320, which are power plant control equipment, a circuit breaker 330, and a variable resistor 390 installed on a distributing board.

The MMISs 310 and 320 may perform a coil monitoring function for monitoring the operational health of a breaker closing coil relay ($R_{CC}$) 340 and a breaker trip coil relay ($R_{TC}$) 350 included in a circuit breaker of a power distributing board, such as a high-voltage breaker board and a low-voltage breaker board.

In order to perform the coil monitoring function, the coil monitoring circuit 300 may include a high-resistance MMIS closing coil monitoring relay ($R_{CM}$) 311 and a high-resistance MMIS trip coil monitoring relay ($R_{TM}$) 321 in the MMISs 310 and 320, which are power plant control equipment. The MMIS closing coil monitoring relay ($R_{CM}$) 311 and the MMIS trip coil monitoring relay ($R_{TM}$) 321 may be respectively connected in series to the breaker closing coil relay ($R_{CC}$) 340 and the breaker trip coil relay ($R_{TC}$) 350 to cause micro current of several μA to flow continuously. For example, when a circuit disconnection such as a disconnection of a coil of the breaker closing coil relay 340 occurs, the MMIS closing coil monitoring relay ($R_{CM}$) 311 and the MMIS trip coil monitoring relay ($R_{TM}$) 321 may detect current breaking, and issue a warning to a manager.

The circuit breaker 330 may include a motor (M) 370 for energy storage for a closing operation, an anti-pumping auxiliary relay ($R_W$) 360 for anti-pumping upon a closing operation of the circuit breaker 330, and electrical components 381, 382, 383, 384, and 385 such as auxiliary contacts 52a, 52b, W, Y, and Z. In FIGS. 3, 52a (382) and 52b (384) represent auxiliary switch contacts. Also, W (383) represents an auxiliary switch contact of the anti-pumping auxiliary relay ($R_W$) 360. Also, Y (385) represents a cut-off switch which is opened when a closing spring is completely charged. Z (387) represents a cut-off switch which is closed when a closing spring is completely charged.

In an embodiment of the present disclosure, the anti-pumping auxiliary relay ($R_W$) 360 may be connected in parallel to the variable resistor 390 installed on the distributing board. According to an embodiment of the present disclosure, since the anti-pumping auxiliary relay ($R_W$) 360 is connected in parallel to the variable resistor ($V_R$) 390 installed on the distributing board, total electrical resistance may be adjusted.

In this case, resistance of the variable resistor ($V_R$) 390 may be set according to the anti-pumping auxiliary relay ($R_W$) 360 and the MMIS closing coil monitoring relay ($R_{CM}$) 311.

For example, if $R_W$ of 11 kΩ is connected in parallel to $V_R$ of 100Ω, electrical composite resistance Rt may be reduced to $Rt=1/\{(1/R_W)+(1/V_R)\}=\{(R_W*V_R)/(R_W+V_R)\}=11,0001*00/(11000+100)=99$.

Figure 4:
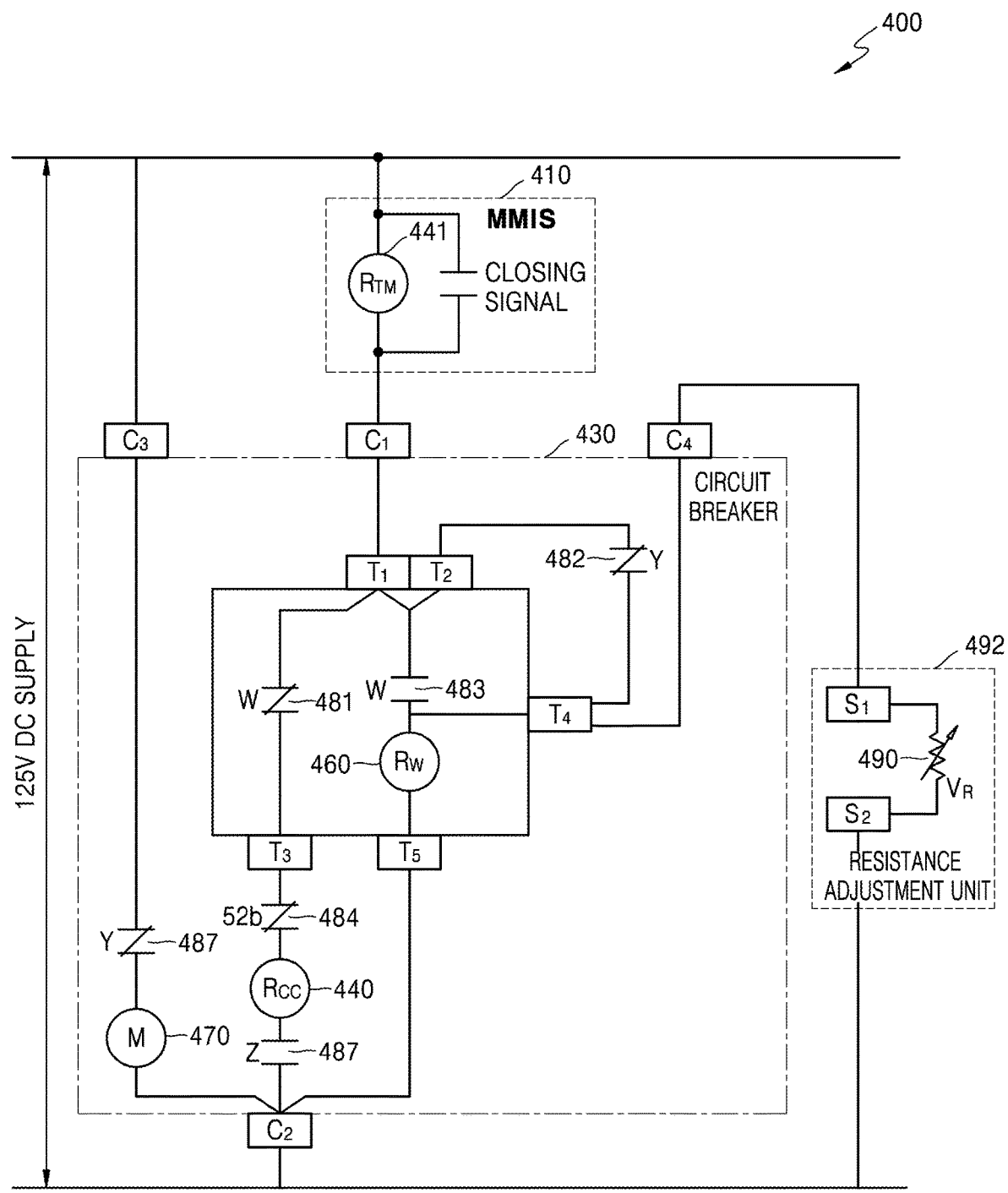

FIG. 4 is an internal wiring diagram of an anti-pumping auxiliary relay ($R_W$) 460 and a variable resistor ($V_R$) 490 in a distributing board, according to an embodiment of the present disclosure.

According to an embodiment of the present disclosure, by installing a resistance adjustment unit 492 on the distributing board, it is possible to lower electrical resistance of the anti-pumping auxiliary relay ($R_W$) 460 in a circuit breaker 430. In FIGS. 3 and 4, a variable resistor $V_R$ is shown as an example of the resistance adjustment unit 492. However, the resistance adjustment unit 492 may be any configuration that can be connected in parallel to the anti-pumping auxiliary relay ($R_W$) 460 to lower total resistance.

FIG. 4 shows a connection relation between the anti-pumping auxiliary relay ($R_W$) 460 and the variable resistor ($V_R$) 490. The resistance adjustment unit 492 may connect a lead of the variable resistor ($V_R$) 490 to terminals $S_1$ and $S_2$ in the distributing board, connect the terminal $S_1$ to an external connection terminal $C_2$ of the circuit breaker 430 through a lead, and connect the terminal $C_2$ to a connection terminal $T_1$ of the anti-pumping auxiliary relay ($R_W$) 460 in the circuit breaker 430 through a lead. Also, the resistance adjustment unit 492 may connect the terminal $S_2$ in the distributing board to a power source through a lead so that the variable resistor ($V_R$) 490 is connected in parallel to the anti-pumping auxiliary relay ($R_W$) 460. A circuit may be configured such that a lead extends to the variable resistor ($V_R$) terminals $S_1$ and $S_2$ in the distributing board and the variable resistor ($V_R$) 490 is connected in parallel to the anti-pumping auxiliary relay ($R_W$) 460.

Figure 5:
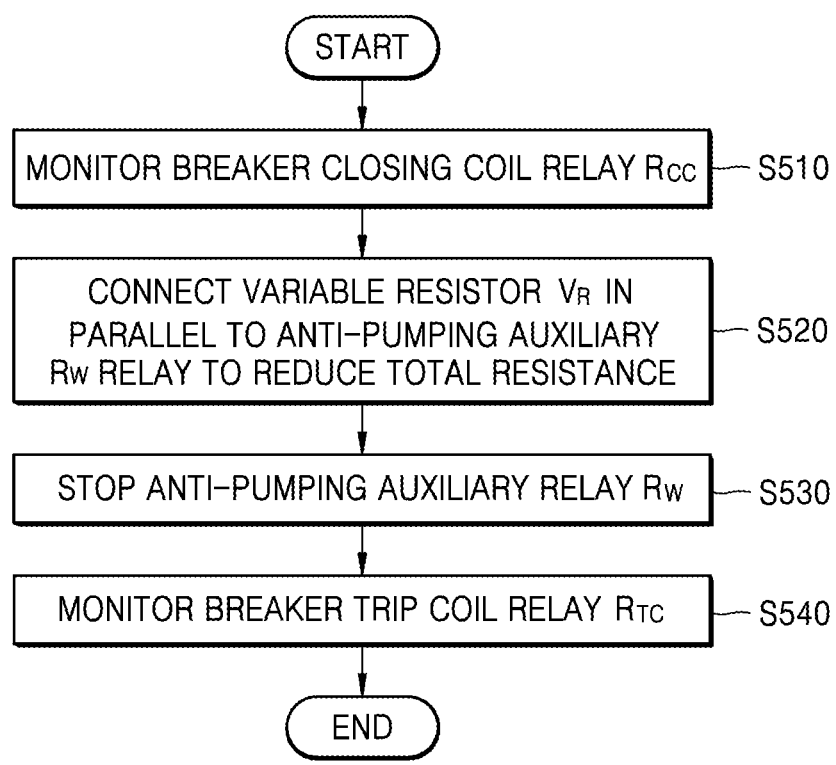
FIG. 5 is a flowchart illustrating an example of a method of detecting a malfunction of a circuit breaker, according to an embodiment of the present disclosure.

FIG. 5 is a flowchart illustrating an example of a method of detecting a malfunction of a circuit breaker, according to an embodiment of the present disclosure.

Operation of an apparatus of preventing a malfunction of a circuit breaker, according to an embodiment of the present disclosure, to implement a circuit shown in FIG. 3 will be described below. Referring to FIG. 3, the MMIS closing coil monitoring relay ($R_{CM}$) 311 included in a first MMIS 310 may monitor any disconnection of the breaker closing coil relay ($R_{CC}$) 340 before the circuit breaker 330 is closed, and if micro current stops, the MMIS closing coil monitoring relay ($R_{CM}$) 311 may provide a warning notice to a manager, in operation S510.

Thereafter, the breaker closing coil relay ($R_{CC}$) 340 in the circuit breaker 330 may operate in response to a closing signal from the first MMIS 310 so that the circuit breaker 330 is closed to open the contact (52b) 384, and the W 383 in the circuit breaker 330 may be closed to connect the variable resistor ($V_R$) 390 installed on the distributing board together with the anti-pumping auxiliary relay ($R_W$) 360 in parallel to the anti-pumping auxiliary relay ($R_W$) 360, thereby reducing total resistance, in operation S520.

Then, micro current flowing through the MMIS closing coil monitoring relay ($R_{CM}$) 311 included in the first MMIS 310 may diverge to flow to the variable resistor ($V_R$) 390 and the anti-pumping auxiliary relay ($R_W$) 360 in the circuit breaker 330, and the anti-pumping auxiliary relay ($R_W$) 360 may stop due to a reduction in an operating voltage, in operation S530.

The MMIS trip coil monitoring relay ($R_{TM}$) 321 included in a second MMIS 320 may monitor any disconnection of the breaker trip coil relay ($R_{TC}$) 350, and if micro current stops, the MMIS trip coil monitoring relay ($R_{TM}$) 321 may provide a warning notice to the manager, in operation S540.

According to an embodiment of the present disclosure, by adding a variable resistor connected in parallel to an anti-pumping auxiliary relay on a distributing board outside a circuit breaker in order to lower circuital resistance of the anti-pumping auxiliary relay used in the circuit breaker, it is possible to reduce total electrical resistance without replacing the circuit breaker.

Thereby, it is possible to prevent a malfunction from occurring between power plant control equipment applied to a nuclear power plant and the circuit breaker.

Also, it is unnecessary to replace the anti-pumping auxiliary relay used in the circuit breaker, and accordingly, a test procedure typically performed when an anti-pumping auxiliary relay is replaced may be no longer needed.

Also, it is possible to efficiently control total electrical resistance through a resistance adjustment unit installed on the distributing board without changing the design of the circuit breaker, although various circuit breakers having different characteristics are used.

It should be understood that embodiments described herein should be considered in a descriptive sense only and not for purposes of limitation. Descriptions of features or aspects within each embodiment should typically be considered as available for other similar features or aspects in other embodiments.

While one or more embodiments have been described with reference to the figures, it will be understood by those of ordinary skill in the art that various changes in form and details may be made therein without departing from the spirit and scope of the disclosure as defined by the following claims.

What is claimed is:

1. An apparatus of preventing a malfunction of a circuit breaker, comprising:
   a first Man-Machine Interface System (MMIS) including an MMIS closing coil monitoring relay $R_{CM}$;
   a second MMIS including an MMIS trip coil monitoring relay $R_{TM}$;
   a circuit breaker including a breaker closing coil relay $R_{CC}$, a breaker trip coil relay $R_{TC}$, and an anti-pumping auxiliary relay $R_W$; and
   a resistance adjustment unit installed on a distributing board, and configured as a variable resistor connected in parallel to the anti-pumping auxiliary relay $R_W$ in the circuit breaker,
   wherein the anti-pumping auxiliary relay $R_W$ is configured to perform anti-pumping when the circuit breaker is closed.

2. The apparatus according to claim 1, wherein resistance of the variable resistor is set to a value varying according to the anti-pumping auxiliary relay $R_W$ and the MMIS closing coil monitoring relay $R_{CM}$.

3. The apparatus according to claim 1, wherein the resistance adjustment unit is configured to lower total resistance produced as resistance of the variable resistor connected in parallel to the anti-pumping auxiliary relay $R_W$, thereby preventing a malfunction of the circuit breaker.

4. The apparatus according to claim 1, wherein the MMIS closing coil monitoring relay $R_{CM}$ is connected in series to the breaker closing coil relay $R_{CC}$ and the MMIS trip coil monitoring relay $R_{TM}$ is connected in series to the breaker trip coil relay $R_{TC}$ to cause current to flow continuously, so that the first MMIS and the second MMIS perform coil monitoring for monitoring operational health of the breaker closing coil relay $R_{CC}$ and the breaker trip coil relay $R_{TC}$ in the circuit breaker.

5. An apparatus of preventing a malfunction of a circuit breaker, comprising a circuit breaker and a variable resistor respectively installed on a distributing board, the variable resistor being disposed outside the circuit breaker separately from the circuit breaker,
   wherein the circuit breaker comprises:
   a breaker closing coil relay $R_{CC}$;
   a breaker trip coil relay $R_{TC}$; and
   an anti-pumping auxiliary relay $R_W$ configured to perform anti-pumping when the circuit breaker is closed,
   wherein the variable resistor is connected in parallel to the anti-pumping auxiliary relay $R_W$, and total resistance of the variable resistor and the anti-pumping auxiliary relay $R_W$ connected in parallel to each other is less than resistance of the anti-pumping auxiliary relay $R_W$.

6. A method of detecting a malfunction of a circuit breaker, comprising:
   connecting a variable resistor installed on a distributing board together with an anti-pumping auxiliary relay $R_W$ in a circuit breaker in parallel to the anti-pumping auxiliary relay $R_W$ to reduce total resistance;
   causing current to flow continuously to the breaker closing coil relay $R_{CC}$ installed in the circuit breaker and connected in series to a Man-Machine Interface System (MMIS) closing coil monitoring relay $R_{CM}$ included in a first MMIS, and causing current to flow continuously to the breaker trip coil relay $R_{TC}$ installed in the circuit breaker and connected in series to an MMIS trip coil monitoring relay $R_{TM}$ included in a second MMIS; and
   providing a notice when the MMIS closing coil monitoring relay $R_{CM}$ and the MMIS trip coil monitoring relay $R_{TM}$ detect a circuit disconnection.

7. The method according to claim 6, wherein the reducing of the total resistance comprises setting resistance of the variable resistor according to the MIS trip coil monitoring relay $R_{TM}$ and the MMIS closing coil monitoring relay $R_{CM}$.

\* \* \* \* \*